(12) United States Patent
Ito et al.

(10) Patent No.: US 10,511,111 B2
(45) Date of Patent: Dec. 17, 2019

(54) CONDUCTOR CONNECTION STRUCTURE OF LAMINATED WIRING BODY

(71) Applicant: YAZAKI CORPORATION, Tokyo (JP)

(72) Inventors: Masahiro Ito, Shizuoka (JP); Yuta Kawamura, Shizuoka (JP); Sadaharu Okuda, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/920,100

(22) Filed: Mar. 13, 2018

(65) Prior Publication Data

US 2018/0301831 A1 Oct. 18, 2018

(30) Foreign Application Priority Data

Apr. 12, 2017 (JP) ................................. 2017-079031

(51) Int. Cl.
*H01R 12/55* (2011.01)
*H01R 11/12* (2006.01)
(Continued)

(52) U.S. Cl.
CPC ......... *H01R 12/55* (2013.01); *B60R 16/0215* (2013.01); *H01R 11/12* (2013.01);
(Continued)

(58) Field of Classification Search
CPC ...... H01R 12/55; H01R 12/72; H01R 12/774; H01R 11/12; H01R 13/2421;
(Continued)

(56) References Cited

U.S. PATENT DOCUMENTS 2,632,039 A 3/1953 Hammerly et al.
3,875,479 A 4/1975 Jaggar
(Continued)

FOREIGN PATENT DOCUMENTS

CN 105764233 A 7/2016
EP 1 465 471 A3 7/2005
(Continued)

OTHER PUBLICATIONS

Chinese Office Action for the related Chinese Patent Application No. 201810327448.2 dated Apr. 22, 2019.
(Continued)

*Primary Examiner* — Andargie M Aychillhum
*Assistant Examiner* — Michael F McAllister
(74) *Attorney, Agent, or Firm* — Kenealy Vaidya LLP

(57) ABSTRACT

A conductor connection structure of a laminated wiring body includes a plurality of plate wiring members which are made of a conductive material and stacked to each other, an insulating layer which is arranged between the vertically-adjacent plate wiring members to insulate the vertically-adjacent plate wiring members, a connection portion which is provided in an upper surface of each of the plate wiring members on a way in an extending direction of the plate wiring members, and a leading-out portion which takes out the connection portion of a lower plate wiring member among the plurality of plate wiring member while avoiding an upper plate wiring member among the plurality of plate wiring member, the lower plate wiring member is arranged at a layer lower than the upper plate wiring member in the laminated wiring body.

10 Claims, 14 Drawing Sheets

(51) Int. Cl.
*H01R 12/72* (2011.01)
*B60R 16/02* (2006.01)
*H01R 13/24* (2006.01)
*H05K 1/02* (2006.01)
*H05K 1/11* (2006.01)
*H05K 1/18* (2006.01)
*H05K 3/40* (2006.01)
*H01R 12/77* (2011.01)
*H01R 13/627* (2006.01)
*H05K 3/20* (2006.01)

(52) U.S. Cl.
CPC ......... *H01R 12/72* (2013.01); *H01R 13/2421* (2013.01); *H05K 1/0228* (2013.01); *H05K 1/117* (2013.01); *H05K 1/183* (2013.01); *H05K 3/4015* (2013.01); *H01R 12/774* (2013.01); *H01R 13/6273* (2013.01); *H05K 1/0298* (2013.01); *H05K 1/115* (2013.01); *H05K 3/202* (2013.01); *H05K 2201/092* (2013.01); *H05K 2201/09581* (2013.01); *H05K 2201/09618* (2013.01); *H05K 2201/1034* (2013.01); *H05K 2201/10272* (2013.01); *H05K 2201/10295* (2013.01); *H05K 2201/10409* (2013.01)

(58) Field of Classification Search
CPC .. H01R 13/6273; H05K 1/0228; H05K 1/183; H05K 1/117; H05K 1/115; H05K 2201/10295; H05K 2201/09618; H05K 2201/09581; H05K 2201/092; H05K 2201/10409; H05K 2201/1034; B60R 16/0215
USPC ........................................................ 174/73.1
See application file for complete search history.

(56) References Cited

U.S. PATENT DOCUMENTS

| | | | |
|---|---|---|---|
| 4,358,633 A | 11/1982 | Reynolds, Jr. | |
| 5,038,257 A | 8/1991 | Agabekov | |
| 5,057,026 A * | 10/1991 | Sawai | H02B 1/207 439/43 |
| 5,530,625 A * | 6/1996 | VanDerStuyf | B60R 16/0238 174/255 |
| 5,684,273 A * | 11/1997 | Erdle | H02G 5/005 174/71 B |
| 6,008,982 A * | 12/1999 | Smith | B60R 16/0238 174/538 |
| 6,244,876 B1 * | 6/2001 | Saka | H02G 5/005 174/59 |
| 6,433,281 B1 * | 8/2002 | Miyajima | H02G 3/16 174/149 B |
| 6,552,274 B1 * | 4/2003 | Nakamura | H01R 9/20 174/151 |
| 8,587,950 B2 * | 11/2013 | Ewing | H01R 25/006 361/752 |
| 9,408,292 B2 * | 8/2016 | Mills | H05K 3/202 |
| 2008/0268671 A1 * | 10/2008 | Harris | H01H 85/046 439/76.2 |
| 2016/0143141 A1 | 5/2016 | Ku et al. | |
| 2016/0149329 A1 | 5/2016 | Nakata | |

FOREIGN PATENT DOCUMENTS

| | | |
|---|---|---|
| JP | 49-13760 Y1 | 4/1974 |
| JP | 8-251779 A | 9/1996 |
| JP | 9-50836 A | 2/1997 |
| JP | 2011-146237 A | 7/2011 |
| JP | 2016-101046 A | 5/2016 |

OTHER PUBLICATIONS

Japanese Office Action for the related Japanese Patent Application No. 2017-079031 dated Jul. 16, 2019.

* cited by examiner

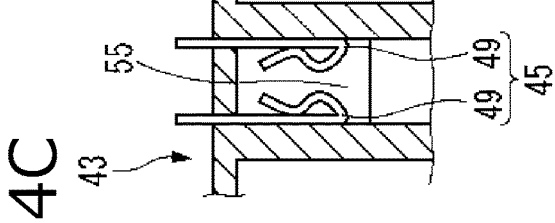
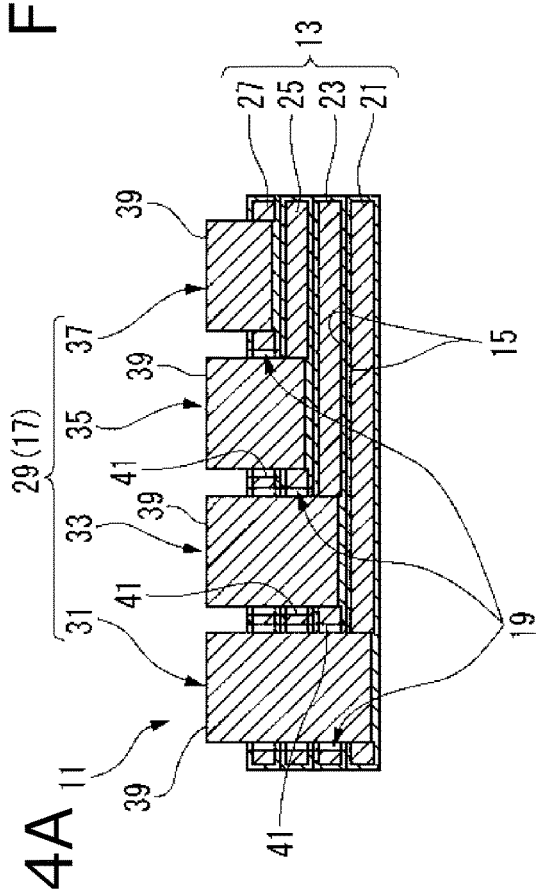
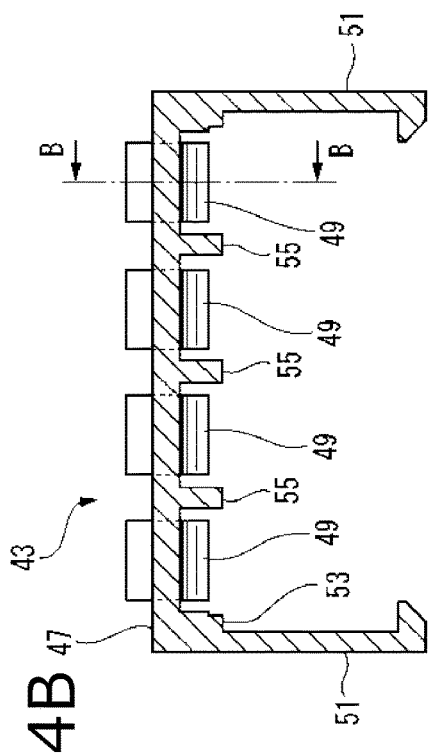

CONDUCTOR CONNECTION STRUCTURE OF LAMINATED WIRING BODY

CROSS REFERENCE TO RELATED APPLICATIONS

This application is based on Japanese Patent Application (No. 2017-079031) filed on Apr. 12, 2017, the contents of which are incorporated herein by reference.

BACKGROUND OF THE INVENTION

1. Field of the Invention

The present invention relates to a conductor connection structure of a laminated wiring body.

2. Description of the Related Art

A laminated wiring body is known in which a plurality of stacked bus bars are provided to form a conductive path or a plurality of wiring bodies are stacked to form a planar wiring body (see JP-A-2011-146237 and JP-A-2016-101046). Such a laminated wiring body is useful in reducing impedance of the conductive path and in lessening an influence of noises while achieving space saving.

However, in the laminated wiring body in the related art, a conductor (plate wiring member) of each layer is basically connected only at both ends. Therefore, there is a request that the plate wiring member of each layer is electrically connected to a mating conductor of an auxiliary component, or the like at an arbitrary position in an extending direction of a longitudinal laminated wiring body with a simple structure and ease without increasing the number of components. In the planar wiring body disclosed in JP-A-2016-101046, a connector is provided on the way in the extending direction. However, there are no other specific configurations except that the connector includes a tab terminal which protrudes to the side of the planar wiring body.

SUMMARY OF THE INVENTION

The invention has been made in view of the circumstances, and an object thereof is to provide a conductor connection structure of a laminated wiring body having a plurality of stacked plate wiring members which can electrically connect a mating conductor to the plate wiring member of each layer wiring member even at positions on the way in an extending direction of the laminated wiring body wiring member with a simple structure and ease, without increasing the number of components.

The above objects are achieved by the following configurations.

(1) There is provided a conductor connection structure of a laminated wiring body including:

a plurality of plate wiring members which are made of a conductive material and stacked to each other;

an insulating layer which is arranged between the vertically-adjacent plate wiring members to insulate the vertically-adjacent plate wiring members;

a connection portion which is provided in an upper surface of each of the plate wiring members on a way in an extending direction of the plate wiring members; and a leading-out portion which takes out the connection portion of a lower plate wiring member among the plurality of plate wiring member while avoiding an upper plate wiring member among the plurality of plate wiring member, the lower plate wiring member is arranged at a layer lower than the upper plate wiring member in the laminated wiring body.

According to the conductor connection structure of the laminated wiring body of the configuration (1), the plurality of plate wiring members and the insulating layers are alternately stacked so that the interlayers are insulated, thereby forming a laminated wiring body of a plurality of circuits. In such a laminated structure, the upper plate wiring member is overlapped with the lower plate wiring member, and an electrical connection to the mating conductor is generally difficult in the upper surface on the way in the extending direction of the lower plate wiring member. Therefore, in the conductor connection structure of the laminated wiring body according to this exemplary configuration, the leading-out portion is provided. The leading-out portion operates not to hinder the upper plate wiring member from being electrically connected with the mating conductor to the connection portion provided in the upper surface of the lower plate wiring member. With this configuration, even though the electrical connection between the plate wiring member of each layer wiring member and the mating conductor has been able to be made only in both ends of the laminated wiring body in the related art, the electrical connection can be made at any position on the way in the extending direction of the laminated wiring body. As a result, the mating conductor of the plurality of auxiliary components mounted at arbitrary positions of the vehicle can be easily connected to the power source in a short distance, for example, using the laminated wiring body which is wired in the front and rear direction of the vehicle. In other words, a plurality of plate wiring members are electrically connected to the mating conductor in a continuously extending state without disconnection over the entire range in the longitudinal direction, and the mating conductor is improved in the freedom degree of selection for a connection position.

(2) For example, the connection portion is a raised piece which is cut and raised in the lower plate wiring member, and the leading-out portion has insertion holes which are bored in both of the upper plate wiring member and the insulating layer to allow the raised piece to pass therethrough.

According to the conductor connection structure of the laminated wiring body of the configuration (2), the raised piece formed in the plate wiring member of each layer wiring member passes through the insertion hole formed in the upper plate wiring member, so that the raised piece of each layer can protrude from the upper surface of the laminated wiring body. In other words, the connector portions of the plate wiring members of all the layers are taken out in the upper surface of the laminated wiring body. The insulating layer is removed from the periphery of the leading end of the raised piece of the taken-out plate wiring member, so that the taken-out plate wiring member is easily connected to the mating conductor such as a mating connector as a so-called card edge terminal. As a result, the leading ends of a plurality of raised pieces which are cut and raised in the plate wiring member of each layer wiring member can be directly used as the card edge terminal, so that a simple connection structure can be achieved, and also it is possible to prevent an increase of components in number.

(3) For example, the connection portion is a contact surface provided in a partial region in an upper surface of the lower plate wiring member, the leading-out portion has exposure holes which are bored in both of the upper plate wiring member and the insulating layer to expose the contact surface to an upper surface of the laminated wiring body.

According to the conductor connection structure of the laminated wiring body of the configuration (3), the insulating layer is removed to form the contact surface in a partial region in the upper surface of the plate wiring member of each layer. The contact surface of the lower plate wiring member is exposed in the upper surface of the laminated wiring body through the exposure hole formed in the upper plate wiring member and the insulating layer. The contact surfaces of all the layers are exposed in the upper surface of the laminated wiring body and can be electrically connected to the mating conductor. The exposed contact surface of the plate wiring member of each layer wiring member can be connected in a state where a protruding abutting terminal (mating conductor) abuts on the leading end of an abutting connector for example. With this configuration, a conductor surface of the plate wiring member itself can be used as a contact surface with respect to the abutting connector, so that a simple connection structure can be achieved, and also it is possible to prevent an increase of components in number.

(4) For example, the connection portion is a columnar fastening member erected in an upper surface of the lower plate wiring member, and the leading-out portion has insertion holes which are bored in both of the upper plate wiring member and the insulating layer to allow the fastening member to pass therethrough.

According to the conductor connection structure of the laminated wiring body of the configuration (4), the fastening member is erected in the upper plate wiring member. Similarly, in the lower plate wiring member, the other fastening member is erected at a position where the other fastening member is not overlapped with the fastening member erected in the upper plate wiring member in the extending direction of the laminated wiring body. The fastening member erected in the lower plate wiring member passes through the insertion hole formed in the upper plate wiring member when the upper plate wiring member is overlapped with the lower plate wiring member. With this configuration, in the upper surface of the laminated wiring body, the fastening member electrically connected to the lower plate wiring member and the fastening member electrically connected to the upper plate wiring member are disposed in parallel in the extending direction of the laminated wiring body. The terminal (mating conductor) such as a mating electric wire is fastened to the plurality of fastening members. According to the conductor connection structure of the laminated wiring body, for example, a pair of fastening members connected to a positive electrode and a negative electrode can be provided in parallel in the upper surface on the way in the extending direction of the laminated wiring body which is relatively narrow.

(5) For example, the connection portion is a columnar fastening member erected in the lower plate wiring member, and the leading-out portion is a detour portion which is bent in a width direction of the plate wiring members to come out of an overlapping area of the plate wiring members.

According to the conductor connection structure of the laminated wiring body of the configuration (5), the fastening member is erected in the plate wiring member. In at least one plate wiring member, the detour portion which is the leading-out portion is formed to be bent in the width direction of the plate wiring member and to come out of the overlapping area of the plate wiring members. The fastening member is erected in the upper surface of the detour portion. The fastening member erected in the detour portion of the plate wiring member is not overlapped with the other plate wiring member when the plate wiring members are overlapped. With this configuration, in the upper surface of the laminated wiring body, the plurality of fastening members are disposed in parallel in the width direction perpendicular to the extending direction of the laminated wiring body. The terminal (mating conductor) such as the mating electric wire is fastened to the fastening member. According to the conductor connection structure of the laminated wiring body, for example, a pair of fastening members connected to the positive electrode and the negative electrode can be provided in parallel in the width direction of the laminated wiring body which is relatively narrow. The insertion hole passing through the fastening member of the lower plate wiring member is not necessarily bored in the upper plate wiring member, so that it is possible to prevent that a cross section in the upper plate wiring member is reduced.

(6) For example, the connection portion is a columnar fastening member erected in the lower plate wiring member, and the leading-out portion is a notched portion which is provided by cutting out one side edge in a width direction of the upper plate wiring member perpendicular to the extending direction of the plate wiring members to insert the fastening member therein.

According to the conductor connection structure of the laminated wiring body of the configuration (6), the fastening member is erected in the upper plate wiring member. Similarly, in the lower plate wiring member, the other fastening member is erected at a position where the other fastening member is not overlapped with the fastening member erected in the upper plate wiring member in the extending direction of the laminated wiring body. The fastening member erected in the lower plate wiring member passes through the notched portion formed in the upper plate wiring member when the upper plate wiring member is overlapped with the lower plate wiring member. With this configuration, in the upper surface of the laminated wiring body, the fastening member electrically connected to the lower plate wiring member and the fastening member electrically connected to the upper plate wiring member are disposed in parallel in the extending direction of the laminated wiring body. The terminal (mating conductor) such as the mating electric wire is fastened to the fastening members.

(7) For example, the plurality of plate wiring members are stacked to form at least a pair of even layers which are electrically connected to a positive electrode and a negative electrode of a power source so as to be connected to an auxiliary component.

According to the conductor connection structure of the laminated wiring body of the configuration (7), the plurality of plate wiring members become the laminated wiring body in which at least a pair of even layers are stacked. The expression "at least a pair of even layers" means two pairs of four layers or three pairs of six layers. In the laminated wiring body, one of the pair of the plate wiring members is connected to the positive electrode of the power source, and the other is connected to the negative electrode. With the conductor connection structure of the laminated wiring body, the laminated wiring body may be configured such that the mating conductor connected to the auxiliary component can be electrically connected to the upper plate wiring member and to the lower plate wiring member at an arbitrary position of the upper surface on the way in the extending direction. With this configuration, the positive electrode and the negative electrode of the power source can be easily connected to the mating conductors of the plurality of auxiliary components mounted at arbitrary positions of the vehicle in a short distance.

According to the conductor connection structure of the laminated wiring body of the invention, it is possible to electrically connect the mating conductor to the plate wiring member of each layer wiring member even at positions on the way in the extending direction of a laminated wiring body with a plurality of stacked plate wiring members with a simple structure and ease, without increasing the number of components.

Hereinbefore, the invention has been described simply. Further, the details of the invention will become apparent from the description of modes (hereinafter, referred to as "embodiments") for carrying out the invention with reference to the accompanying drawings.

BRIEF DESCRIPTION OF THE DRAWINGS

FIG. 4A is a cross-sectional view taken along line A-A of FIG. 2, FIG. 4B is a cross-sectional view of a mating connector to be combined with the laminated wiring body illustrated in FIG. 1, and FIG. 4C is a cross-sectional view taken along line B-B of FIG. 4B;

DETAILED DESCRIPTION OF THE EXEMPLARY EMBODIMENTS

Hereinafter, embodiments of the invention will be described with reference to the drawings.

First Embodiment

Figure 1:
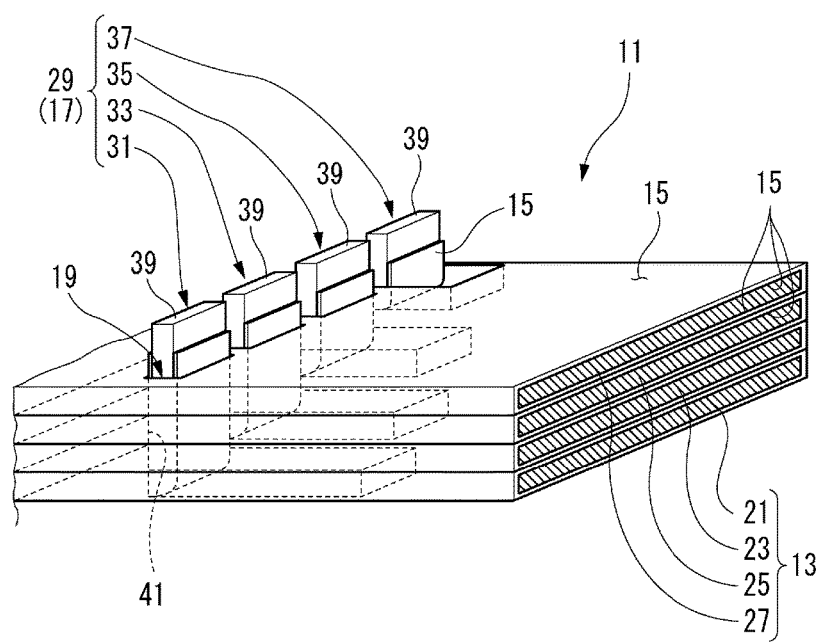
FIG. 1 is a perspective view illustrating main parts of a laminated wiring body which includes a conductor connection structure of a laminated wiring body according to a first embodiment of the invention.
Figure 2:
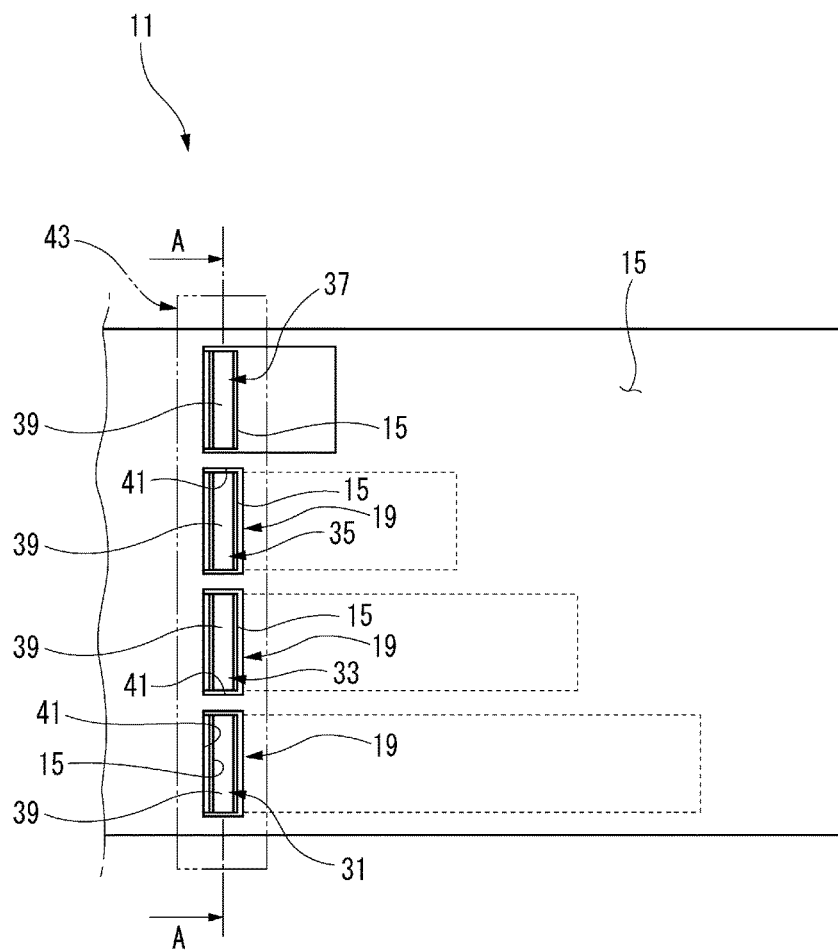
FIG. 2 is a top view of the laminated wiring body illustrated in FIG. 1.
Figure 3:
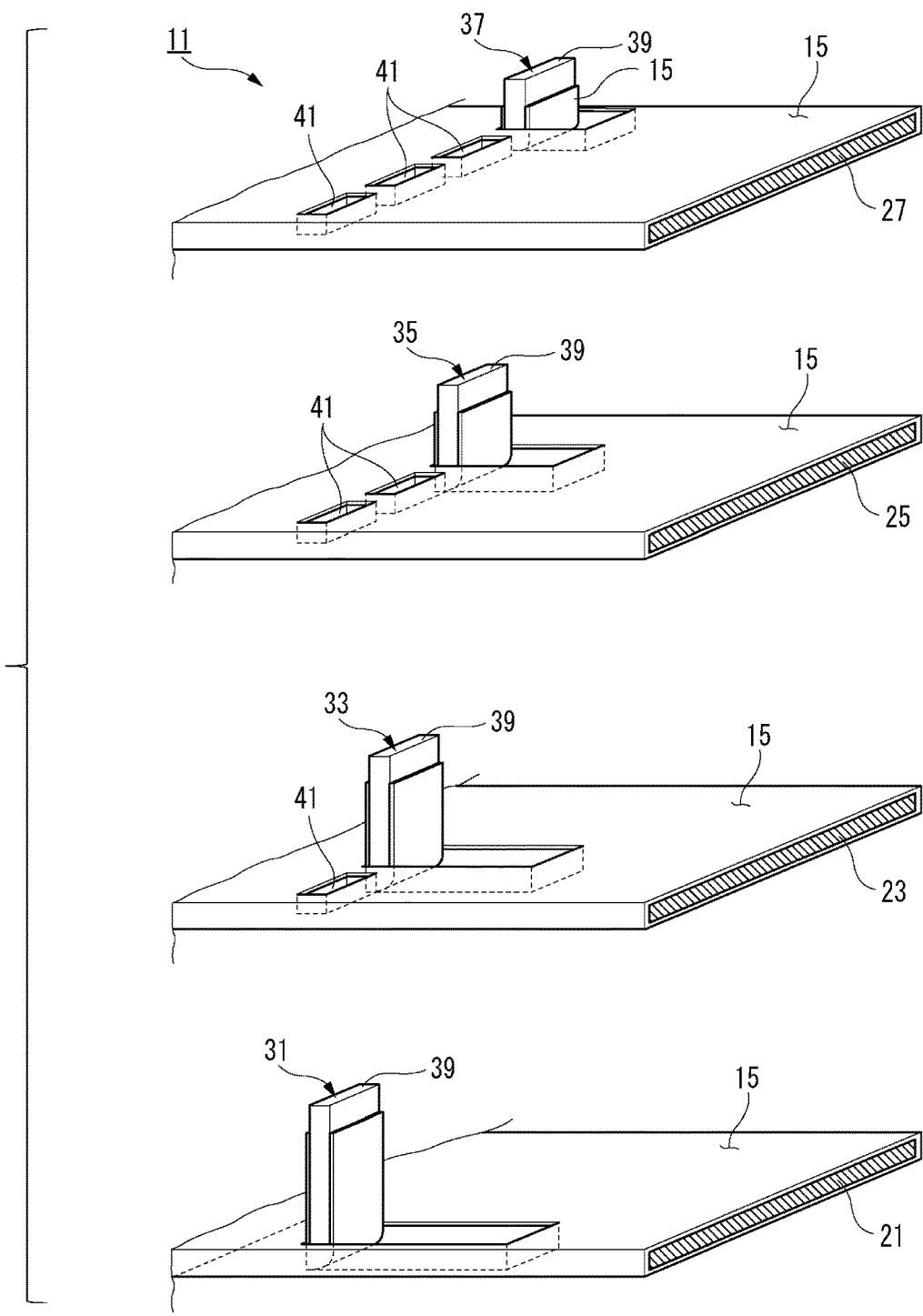
FIG. 3 is an exploded perspective view of the laminated wiring body illustrated in FIG. 1.

FIGS. 1 to 3 are a perspective view, a top view, and an exploded perspective view illustrating main parts of a laminated wiring body 11 which includes a conductor connection structure of a laminated wiring body according to a first embodiment of the invention. The conductor connection structure of the laminated wiring body according to the first embodiment mainly includes a plate wiring member 13, an insulating layer 15, a connection portion 17, and a leading-out portion 19.

The plate wiring member 13 is made of a conductive material, and formed by stacking a plurality of layers. The plurality of layers of the plate wiring member 13 are stacked through the insulating layer 15 to form the laminated wiring body 11. The number of stacking layers of the plate wiring member 13 is not particularly limited. In other words, the laminated wiring body 11 may be formed of four layers as illustrated in the drawing, or may be two layers. In this embodiment, a first plate wiring member 21, a second plate wiring member 23, a third plate wiring member 25, and a fourth plate wiring member 27 are stacked in this order from the lower layer to form the four-layer laminated wiring body 11 of four layers.

The four-layer laminated wiring body 11 may include four circuits. For example, these four circuits may be formed of a 48 V negative circuit, a 48 V positive circuit, a 12 V positive circuit, and a 12 V negative circuit in this order from the lower layer. As such an example of the stacked layer, the second plate wiring member 23 and the third plate wiring member 25 which are adjacent are desirably formed to have the same polarity. The second plate wiring member 23 is formed as "48 V positive circuit", and the third plate wiring member 25 is formed as "12 V positive circuit". The laminated wiring body 11 formed by stacking a number of circuits is formed such that the layers of the same polarity are disposed adjacent, so that crosstalk causing noises of a power-system layer to be transferred to a signal-system layer is prevented, and the noise resistance performance can be improved.

The plate wiring member 13 is made of a conductive material such as copper, copper alloy, aluminum, and aluminum alloy in a shape of a long strip plate, and is formed such that a cross section perpendicular to the longitudinal direction has a rectangular shape. In the plate wiring member 13, a width direction is a direction perpendicular to the longitudinal direction, and a thickness direction is a direction of stacking layers. The plate wiring member 13 is formed to have an extremely large width compared to the thickness.

The insulating layer 15 is interposed between the vertically-adjacent plate wiring members 13. The plate wiring members 13 are electrically insulated by interposing the insulating layer 15 between the plate wiring members 13. Any insulating material may be used as the insulating layer 15 as long as the material electrically insulates the plate wiring members 13 from each other. The insulating layer 15 may be formed by performing a power coating on at least any one of the front surface and the rear surface of each plate wiring member 13 for example. In this embodiment, the front and rear surfaces of the plate wiring members 13 (the first plate wiring member 21, the second plate wiring member 23, the third plate wiring member 25, and the fourth plate wiring member 27) each are formed with the insulating layer 15 by the powder coating. As the powder coating, there are two primary methods such as "electrostatic coating method (spray coating)" and "fluidized bed dip coating method (dip coating)". The insulating layer 15 may be formed by any of these powder coating methods. In a case where the insulating layer 15 is formed by the powder coating, the plurality of plate wiring members 13 is stacked after the insulating layer 15 is provided.

Besides, the plate wiring member 13 may be formed such that the plate wiring members 13 are electrically insulated from each other by a sheet material (insulating sheet) of an electrical insulation property. In this case, the plurality of plate wiring members 13 and the insulating sheet are stacked alternately. The plate wiring members 13 may be stacked after being bonded with an insulating sheet on the front and rear surfaces in advance. The plate wiring member 13 formed of a plurality of layers with the insulating sheet interposed therebetween is further covered by the insulating layer 15 around the outer periphery so as to form the non-laminated wiring body 11 of which both side surfaces in the longitudinal direction are covered. Therefore, the laminated wiring body 11 is structured to expose a conductor surface of the plate wiring member 13 only in the both end surfaces in the extending direction.

In the conductor connection structure of the laminated wiring body according to the first embodiment, the connection portion 17 is provided in each upper surface on the way in the extending direction of the plate wiring member 13. In the first embodiment, the connection portion 17 is formed of a raised piece 29 (a first raised piece 31, a second raised piece 33, a third raised piece 35, and a fourth raised piece 37) which is cut and raised in each plate wiring member 13 (the first plate wiring member 21, the second plate wiring member 23, the third plate wiring member 25, and the fourth plate wiring member 27). The raised piece 29 is formed such that a U cutting shape is formed in the plate wiring member 13, a leading end is bent and raised vertically to the plate wiring member 13 from a portion connected with the plate wiring member 13 as a base end. The U cutting shape is set such that the raised piece 29 formed in the plate wiring member 13 of each layer wiring member protrudes by the same length from the upper surface of the laminated wiring body 11 as illustrated in FIG. 1.

In other words, as illustrated in FIG. 3, the first raised piece 31 is formed in the first plate wiring member 21. The second raised piece 33 is formed in the second plate wiring member 23. The third raised piece 35 is formed in the third plate wiring member 25. The fourth raised piece 37 is formed in the fourth plate wiring member 27. The raised leading end of the raised piece 29 has no insulating layer 15 and serves as an electric contact portion 39 from which the plate wiring member 13 is exposed. The electrical contact portion 39 is formed by removing the preformed insulating layer 15. Alternatively, the electrical contact portion may be formed by masking out the insulating layer 15 when the insulating layer 15 is formed.

The leading-out portion 19 is formed in the upper side (the second plate wiring member 23, the third plate wiring member 25, and the fourth plate wiring member 27) of the plate wiring member 13. The leading-out portion 19 is a portion (a portion for electrical connection from the upper surface of the laminated wiring body 11) for taking out the connection portion 17 (raised piece 29) raised from the lower side (the first plate wiring member 21, the second plate wiring member 23, and the third plate wiring member 25) of the plate wiring member 13 to the upper surface of the laminated wiring body 11 while avoiding the plate wiring member 13 on the upper side. In other words, the leading-out portion is a portion for allowing a mating conductor to be electrically connected to the connection portion 17 of the plate wiring member 13 on the lower side.

In the first embodiment, the leading-out portion 19 is formed of an insertion hole 41 which is bored in the upper side (the second plate wiring member 23, the third plate wiring member 25, and the fourth plate wiring member 27) of the plate wiring member 13 and the respective insulating layers 15 to allow the raised piece 29 (the first raised piece 31, the second raised piece 33, and the third raised piece 35) to pass therethrough.

The raised pieces 29 are desirably insulated from the plate wiring members 13 of the respective layers wiring member in the inner periphery of the insertion hole 41 by an insulating structure. In other words, the raised piece 29 is formed such that, in a case where the front and rear surfaces of the plate wiring member 13 is insulated in advance by the powder coating or by bonding an insulating sheet, a non-insulated surface having no insulating layer 15 is exposed from both sides of the raised piece 29 by cutting and raising. The non-insulated surface may be insulated by coating a curable insulating material before the raised piece 29 is inserted into the insertion hole 41 (that is, before the plate wiring member 13 is stacked).

In a case where the raised piece 29 is insulated by the powder coating after the raised piece 29 is formed in the plate wiring member 13, both sides of the raised piece 29 are also coated to be insulated at the same time with the front and rear surfaces of the plate wiring member 13. In this way, the insulating structure may be formed such that both sides of the plate wiring member 13 are insulated at the same time with the front and rear surface of the plate wiring member 13.

The raised piece 29 may be insulated from the plate wiring member 13 of each layer wiring member in the insertion hole 41 by inserting both sides of the raised piece 29 into the insertion hole 41 with a sufficient gap separated from the inner surface. According to such an insulating structure, the plate wiring member 13 is insulated by the powder coating or by bonding an insulating sheet, and then the raised piece 29 can be formed. In this way, the insulating structure may be configured such that both sides of the raised piece 29 are insulated by a separated space secured by the insertion hole 41. Further, in the insulating structure, a space between the raised piece 29 and the insertion hole 41 in which the separated space is secured may be filled and cured with an insulating material, or an insulating elastic member may be fitted thereto.

As illustrated in FIGS. 1 and 2, the plurality of raised pieces 29 may be formed such that the respective electrical contact portions 39 are disposed on a straight line along the width direction of the laminated wiring body 11 for example. The layout of the electrical contact portions 39 in the laminated wiring body 11 is not limited to the above structure as described in a modification below.

As illustrated in FIG. 4A, the electrical contact portions 39 protruding from the upper surface of the laminated wiring body 11 have structures similar to a so-called card edge terminal. Herein, in the conductor connection structure of the laminated wiring body according to the first embodiment, the mating connector 43 similar to the card edge type is connected to the laminated wiring body 11, so that the mating conductor can be electrically connected to the plate wiring members 13 of the respective layers.

The mating connector 43 illustrated in the example of FIG. 4B includes card edge terminals 45 (four mating conductors) corresponding to the electrical contact portions 39 in an insulating housing 47. In other words, one mating connector 43 can be connected to four circuits at the same time. As illustrated in FIG. 4C, each card edge terminal 45 includes a pair of contact pieces 49 which interpose the electrical contact portion 39 from the front and rear sides. The upper end of each contact piece 49 is electrically connected to an electric line such as a branch line by a connection structure (not illustrated; for example, a pressure blade connection or a terminal connection in a bus bar circuit provided on a substrate).

In the insulating housing 47, a pair of flexible engaging arms 51 to be engaged to the lower surface of the laminated wiring body 11 are perpendicularly provided on both sides in the width direction. In the flexible engaging arm 51, the insulating housing 47 to which the card edge terminal 45 is electrically connected to the electrical contact portion 39 is engaged to the laminated wiring body 11 to prevent separation. A connection opening 53 of the insulating housing 47 where the card edge terminals 45 are disposed includes a plurality of insulating walls 55 to separate the card edge terminals 45.

Figure 5:
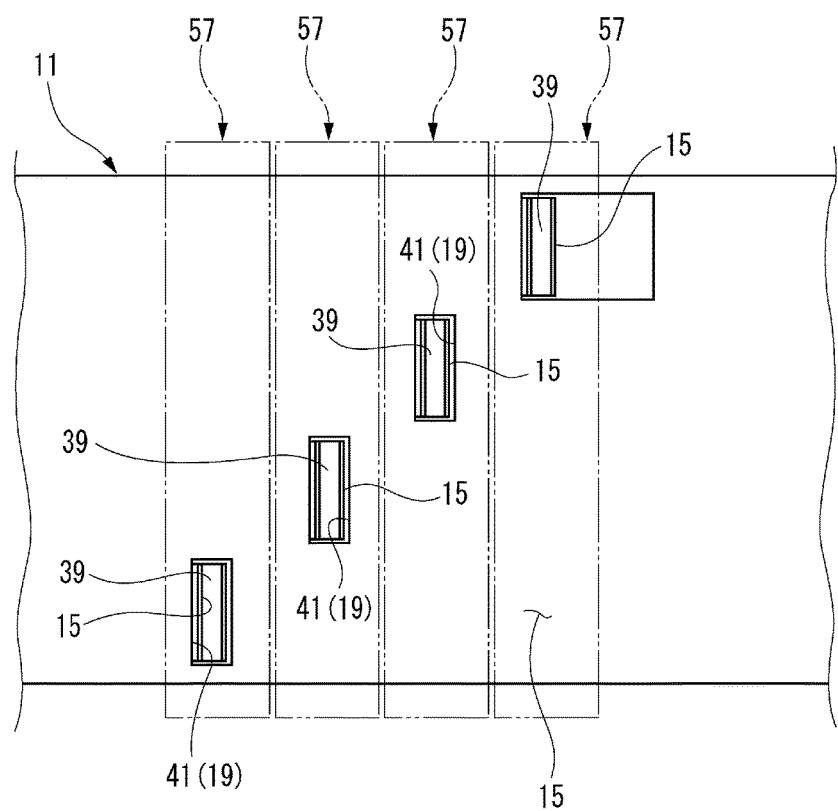
FIG. 5 is a top view illustrating a modification of the laminated wiring body according to the first embodiment of the invention.

FIG. 5 is a top view illustrating a modification of the laminated wiring body 11 according to the first embodiment of the invention. The plurality of electrical contact portions 39 protruding from the upper surface of the laminated wiring body 11 may be disposed to be shifted in the extending direction of the laminated wiring body 11 in a stacking order. In the modification illustrated in FIG. 5, the electrical contact portion 39 of the second raised piece 33 is disposed on the right side of the electrical contact portion 39 of the first raised piece 31 in the drawing, the electrical contact portion 39 of the third raised piece 35 is disposed on the right side of the electrical contact portion 39 of the second raised piece 33 in the drawing, and the electrical contact portion 39 of the fourth raised piece 37 is disposed on the right side of the electrical contact portion 39 of the third raised piece 35 in the drawing. According to a layout pattern of the electrical contact portion 39, the mating connector 57 for a single circuit corresponding to respective layer may be connected to four places as needed.

Figure 6:
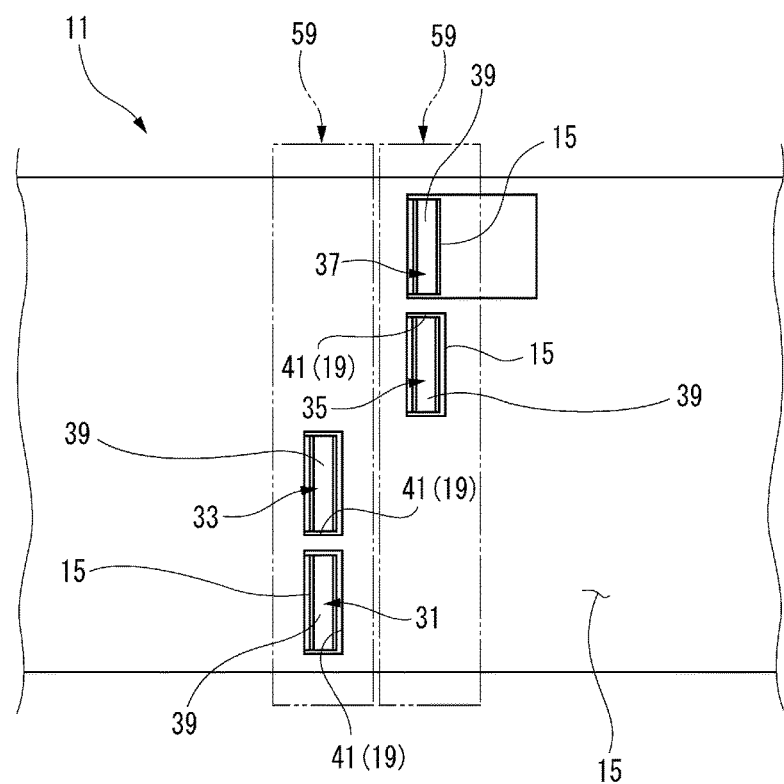
FIG. 6 is a top view illustrating another modification of the laminated wiring body according to the first embodiment of the invention.

FIG. 6 is a top view illustrating another modification of the laminated wiring body 11 according to the first embodiment of the invention. The plurality of electrical contact portions 39 protruding from the upper surface of the laminated wiring body 11 may be disposed in parallel by arranging a pair of positive and negative circuits for the same voltage. In the modification illustrated in FIG. 6, the electrical contact portion 39 of the first raised piece 31 of a 48 V negative circuit and the electrical contact portion 39 of the second raised piece 33 of a 48 V positive circuit are paired up and disposed in parallel in the width direction. The electrical contact portion 39 of the third raised piece 35 of a 12 V positive circuit and the electrical contact portion 39 of the fourth raised piece 37 of a 12 V negative circuit are paired up and disposed in parallel in the width direction. According to the layout pattern of the electrical contact portion 39, the mating connectors 59 for different voltages which are connected to the positive voltage electrode and the negative voltage electrode may be connected at two places as needed.

Figure 7:
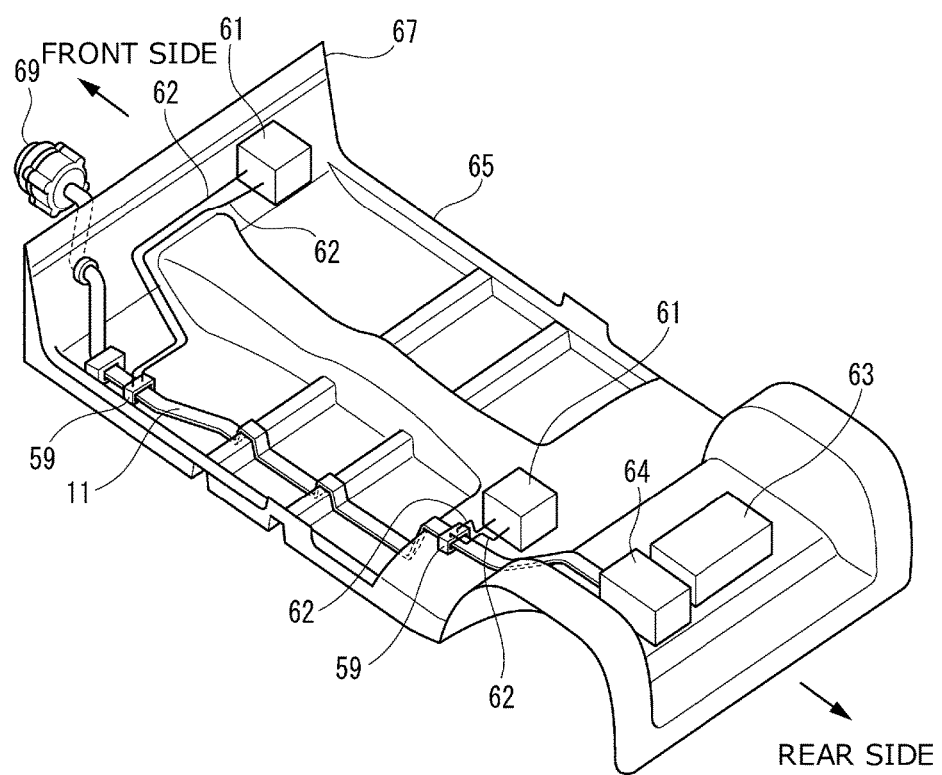
FIG. 7 is a perspective view illustrating a state in which the laminated wiring body illustrated in FIG. 1 is mounted in a vehicle.

FIG. 7 is a perspective view illustrating a state where the laminated wiring body 11 illustrated in FIG. 1 is mounted in a vehicle. In the conductor connection structure of the laminated wiring body according to this embodiment, the laminated wiring body 11 formed of the plurality of stacked plate wiring members 13 is desirably stacked as at least a pair of even layers which are electrically connected to a positive electrode and a negative electrode of a power source so as to be connected to a branch line 62 of an auxiliary component 61 through the mating connector 59. The expression "at least a pair of even layers" means a pair of two layers, two pairs of four layers, or three pairs of six layers. The laminated wiring body 11 of the first embodiment is formed in two pairs of four layers.

As illustrated in FIG. 7, the laminated wiring body 11 is wired in a vehicle in which a battery 63 is disposed on the rear side for example. The laminated wiring body 11 is wired in the upper surface of a floor panel 65 of the vehicle in the front and rear direction of the vehicle. The rear end of the laminated wiring body 11 is electrically connected to a fuse box 64 which is connected to the battery 63 on the rear side. The front end of the laminated wiring body 11 passes through a though hole provided in a dash panel 67 and is connected to an alternator 69 positioned in an engine room.

As described above, the laminated wiring body 11 according to the first embodiment may be configured such that one (for example, the second plate wiring member 23) of the pair of plate wiring members 13 is connected to the positive electrode of the power source, and the other (for example, the first plate wiring member 21) may be connected to the negative electrode. With the conductor connection structure of the laminated wiring body, the laminated wiring body 11 may be configured such that a circuit is taken out at an arbitrary position of the upper surface on the way in the extending direction from the plate wiring member 13 of the upper layer, and also from the plate wiring member 13 of an arbitrary lower layer.

With this configuration, the laminated wiring body 11 can connect the positive electrode and the negative electrode for the power source to a plurality of auxiliary components 61 mounted at arbitrary positions of the vehicle by a short branch line 62. As an example of the auxiliary component 61, there are a meter and a multimedia display on the front side, and slide seats in the second row on the rear side.

Next, the operations of the above-described configuration will be described. In the conductor connection structure of the laminated wiring body according to the first embodiment, the four-layered plate wiring member 13 and the insulating layer 15 are alternatively stacked to be insulated so as to form the laminated wiring body 11 of the four circuits. In such a stacked structure, the plate wiring member 13 on the upper side is overlapped with the plate wiring member 13 on the lower side, and an electrical connection to the mating conductor is generally difficult in the upper surface on the way in the extending direction of the plate wiring member 13 on the lower side. Therefore, in the conductor connection structure of the laminated wiring body according to the first embodiment, the leading-out portion 19 is provided. The leading-out portion 19 is operated while not hindering the plate wiring member 13 on the upper side from being electrically connected with the mating conductor (card edge terminal 45) to the connection portion 17 provided in the upper surface of the plate wiring member 13 on the lower side.

With this configuration, even though the electrical connection between the plate wiring member 13 of each layer wiring member and the mating conductor has been able to be made only in both ends of the laminated wiring body 11 in the related art, the electrical connection can be made at any position on the way in the extending direction of the laminated wiring body 11. As a result, the mating conductor (card edge terminal 45) connected to the branch line 62 of the plurality of auxiliary components 61 mounted at arbitrary positions of the vehicle can be easily connected to the power source in a short distance, for example, using the long laminated wiring body 11 for a main line which is wired in the front and rear direction of the vehicle. In other words, the four-layered plate wiring member 13 is electrically connected to the mating conductor in a continuous extending state without disconnection over the entire range in the longitudinal direction, and the mating conductor is improved in the freedom degree of selection for a connection position.

In the conductor connection structure of the laminated wiring body of the first embodiment, the raised piece 29 serving as the connection portion 17 formed in the plate wiring member 13 of each layer of wiring member passes through the insertion hole 41 formed in the plate wiring member 13 on the upper side, so that the raised leading end of the raised piece 29 of each layer is made to protrude as the electrical contact portion 39 from the upper surface of the laminated wiring body 11. In other words, the raised pieces 29 of the plate wiring members 13 of all layers are taken out of the upper surface of the laminated wiring body 11. The insulating layer 15 is removed from the periphery of the leading end of the raised piece 29 of the taken-out plate wiring member 13, so that the raised piece 29 as a so-called card edge terminal is easily connected to the card edge terminal 45 of the mating connector 43. As a result, the leading end of the raised piece 29 which is cut and raised in the plate wiring member 13 of each layer wiring member can be directly used as the card edge terminal, so that a simple connection structure can be achieved, and also it is possible to prevent an increase of components in number.

In the conductor connection structure of the laminated wiring body of the first embodiment, the plurality of plate wiring members 13 becomes the laminated wiring body 11 in which at least a pair of even layers are stacked. In the laminated wiring body 11, one of the pair of the plate wiring members 13 is connected to the positive electrode of the power source, and the other is connected to the negative electrode. With the conductor connection structure of the laminated wiring body, the laminated wiring body 11 may be configured such that the mating conductor (card edge terminal 45) connected to the branch line 62 of the auxiliary component 61 can be electrically connected to the plate wiring member 13 on the upper side and to the plate wiring member 13 on the lower side at an arbitrary position of the upper surface on the way in the extending direction. With this configuration, the positive electrode and the negative electrode of the power source can be easily connected to the plurality of auxiliary components 61 mounted at arbitrary positions of the vehicle in a short distance.

Second Embodiment

Figure 8:
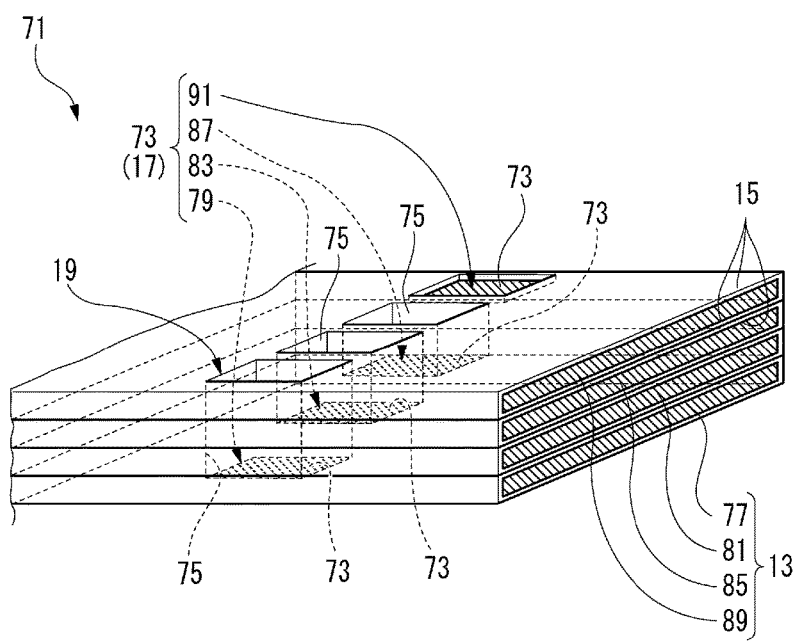
FIG. 8 is a perspective view illustrating main parts of a laminated wiring body which includes a conductor connection structure of a laminated wiring body according to a second embodiment of the invention.
Figure 9:
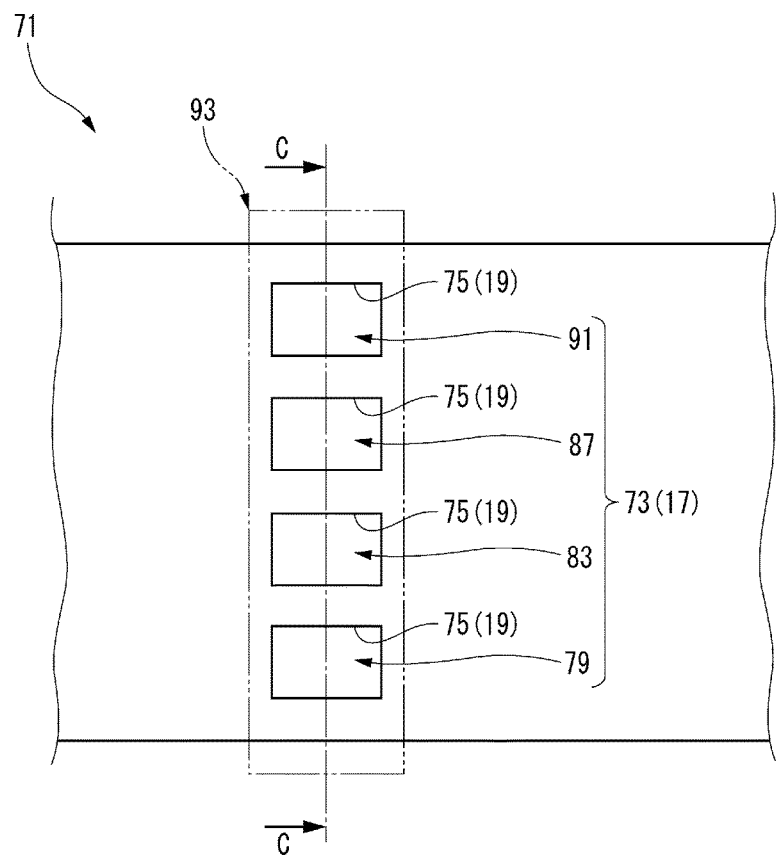
FIG. 9 is a top view of the laminated wiring body illustrated in FIG. 7.
Figure 10:
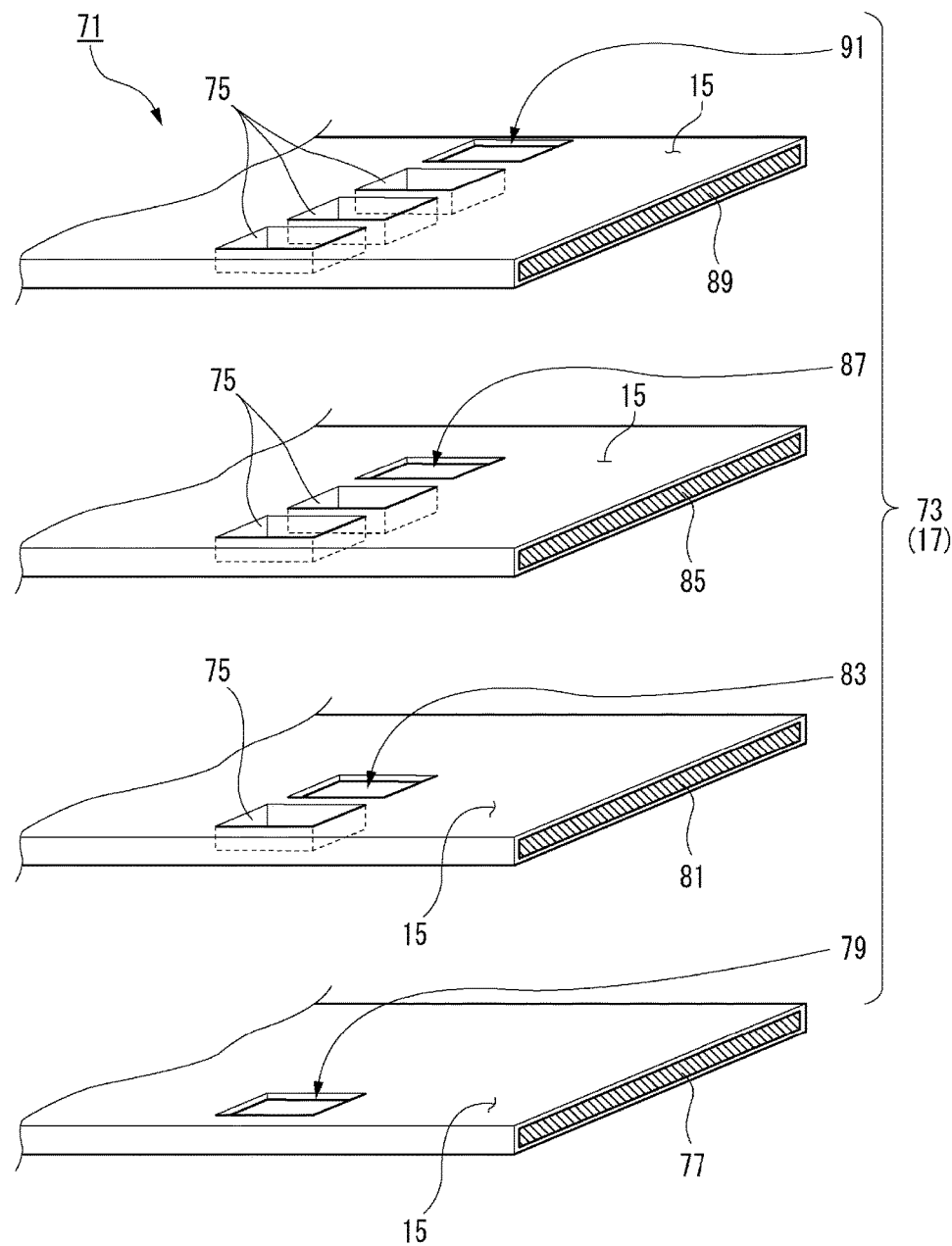
FIG. 10 is an exploded perspective view of the laminated wiring body illustrated in FIG. 8.

Next, the description will be given about a second embodiment of a conductor connection structure of a laminated wiring body according to the invention. FIGS. 8 to 10 are a perspective view, a top view, and an exploded perspective view illustrating main parts of a laminated wiring body 71 provided with the conductor connection structure of the laminated wiring body according to the second embodiment of the invention. In the second embodiment, the same members as those described in the first embodiment are assigned with the same symbols, and the redundant description will be omitted. In the conductor connection structure of the laminated wiring body according to the second embodiment, the connection portion 17 of the laminated wiring body 71 becomes a contact surface 73 which is formed in a partial region in the upper surface of the plate wiring member 13.

The contact surface 73 is formed in a rectangular shape for example. The contact surface 73 may be formed by subjecting the plate wiring member 13 to a power coating with a mask at a predetermined position, or by bonding an insulating sheet having a rectangular hole at a predetermined position. In the second embodiment, the leading-out portion 19 is bored in the plate wiring member 13 on the upper side and the insulating layer 15 to form an exposure hole 75 to expose the contact surface 73 in the upper surface of the laminated wiring body 71. The exposure hole 75 can be formed similarly to the insertion hole 41 of the first embodiment.

In other words, as illustrated in FIG. 10, a first contact surface 79 is formed in a first plate wiring member 77 (plate wiring member 13). A second contact surface 83 is formed in a second plate wiring member 81. A third contact surface 87 is formed in a third plate wiring member 85. A fourth contact surface 91 is formed in a fourth plate wiring member 89. The exposure hole 75 is formed in the second plate wiring member 81 (plate wiring member 13) to expose the first contact surface 79 of the first plate wiring member 77. Two exposure holes 75 are formed in the third plate wiring member 85 to expose the first contact surface 79 of the first plate wiring member 77 and the second contact surface 83 of the second plate wiring member 81, respectively. Three exposure holes 75 are formed in the fourth plate wiring member 89 to expose the first contact surface 79 of the first plate wiring member 77, the second contact surface 83 of the second plate wiring member 81, and the third contact surface 87 of the third plate wiring member 85, respectively.

As illustrated in FIG. 9, the plurality of contact surfaces 73 and exposure holes 75 may be formed to be disposed on a straight line along in the width direction of the laminated wiring body 71 for example. The layout of the contact surfaces 73 and the exposure holes 75 in the laminated wiring body 71 is not limited to the above layout. In other words, the layout may be the same layout pattern as the plurality of electrical contact portions 39 illustrated in FIGS. 5 and 6.

Figure 11A:
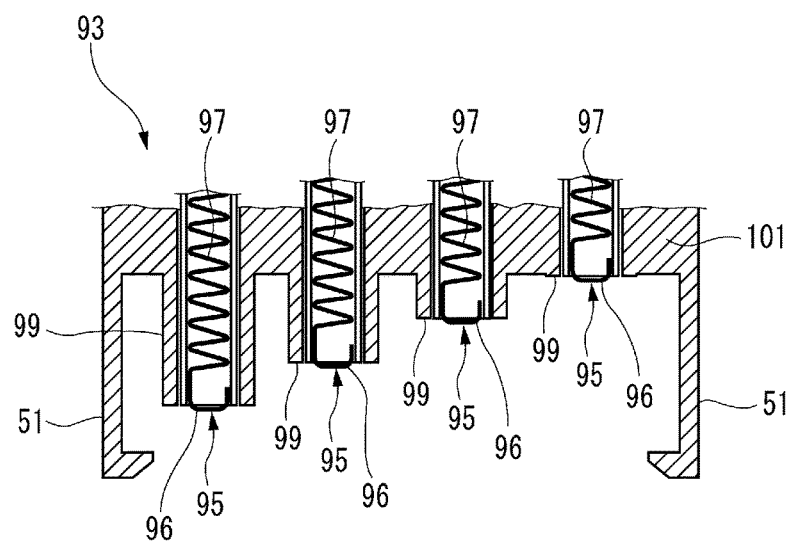
FIG. 11A is a cross-sectional view of a mating connector to be combined to the laminated wiring body illustrated in FIG. 8
Figure 11B:
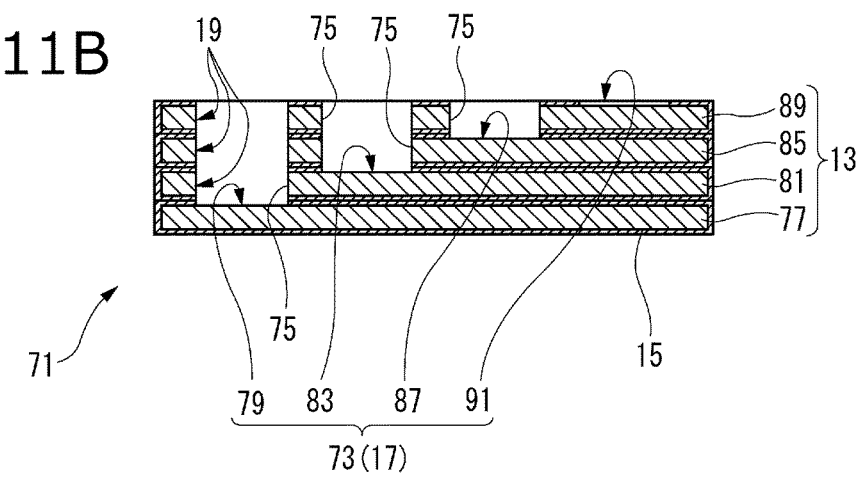
FIG. 11B is a cross-sectional view taken along line C-C of FIG. 9.

As illustrated in FIG. 11B, the contact surface 73 exposed in the bottom surface of each exposure hole 75 of the laminated wiring body 71 can be electrically connected with a mating conductor by a so-called abutting connector 93 (mating connector).

The abutting connector 93 illustrated in the example of FIG. 11A includes abutting terminals 95 (four mating conductors) corresponding to respective contact surfaces 73 in an insulating housing 101. The abutting terminal 95 includes a leading end contact portion 96 which is movable forward and backward by an elastic portion 97, and is stored in an exposure-hole insertion portion 99. The exposure-hole insertion portion 99 is integrally formed with an electrically insulating housing 101 in a cylinder shape. The abutting connector 93 can be connected to four circuits at the same time.

As described above, the abutting connector 93 may be formed as four connectors for a single circuit to correspond to the respective layers, or may be formed as two pairs of connectors for different voltages to be connected with the positive and negative electrodes of the respective voltages.

In the conductor connection structure of the laminated wiring body according to the second embodiment, the insulating layer 15 is partially removed from a partial region in the upper surface of the plate wiring member 13 of each layer wiring member to form the contact surface 73. The contact surface 73 (the first contact surface 79 of the first plate wiring member 77, the second contact surface 83 of the second plate wiring member 81, and the third contact surface 87 of the third plate wiring member 85) of the plate wiring member 13 on the lower side is exposed in the upper surface of the laminated wiring body 71 by the exposure hole 75 which is formed in the plate wiring member 13 on the upper side (the second plate wiring member 81, the third plate wiring member 85, and the fourth plate wiring member 89) and the insulating layer 15. The contact surfaces 73 of all the layers are exposed in the upper surface of the laminated wiring body 71, and the electrical connection (access) to the abutting terminal 95 (mating conductor) can be made. In other words, the contact surface 73 of the plate wiring member 13 of each layer wiring member which is exposed in the upper surface of the laminated wiring body 71 can be connected in a state where the protruding abutting terminal 95 abuts on the leading end of the abutting connector 93. With this configuration, the conductor surface of the plate wiring member 13 itself can be used as the contact surface 73 with respect to the abutting connector 93, so that a simple connection structure can be achieved, and also it is possible to prevent an increase of components in number.

According to the conductor connection structure of the laminated wiring body of the second embodiment, the exposure-hole insertion portion 99 of the abutting connector 93 is inserted into the exposure hole 75 of the laminated wiring body 71, so that it is possible to securely insulate a non-insulated surface of the plate wiring member 13 in each layer exposed in the inner periphery surface of the exposure hole 75 and the abutting terminal 95.

According to the conductor connection structure of the laminated wiring body of the second embodiment, the plurality of exposure-hole insertion portions 99 of the abutting connector 93 are inserted to the exposure holes 75, and thus it is possible to prevent the abutting connector 93 from being erroneously combined in the opposite direction (the right and left direction of FIGS. 11A and 11B).

Further, according to the conductor connection structure of the laminated wiring body of the second embodiment, the plurality of exposure-hole insertion portions 99 of the abutting connector 93 are inserted to the exposure holes 75, and thus the abutting connector 93 can be regulated in movement with respect to the laminated wiring body 71 without a complex fitting structure. With this configuration, it is possible to achieve a highly reliable combining structure in which the position is hardly deviated even if there is vibration or impact.

Third Embodiment

Figure 12:
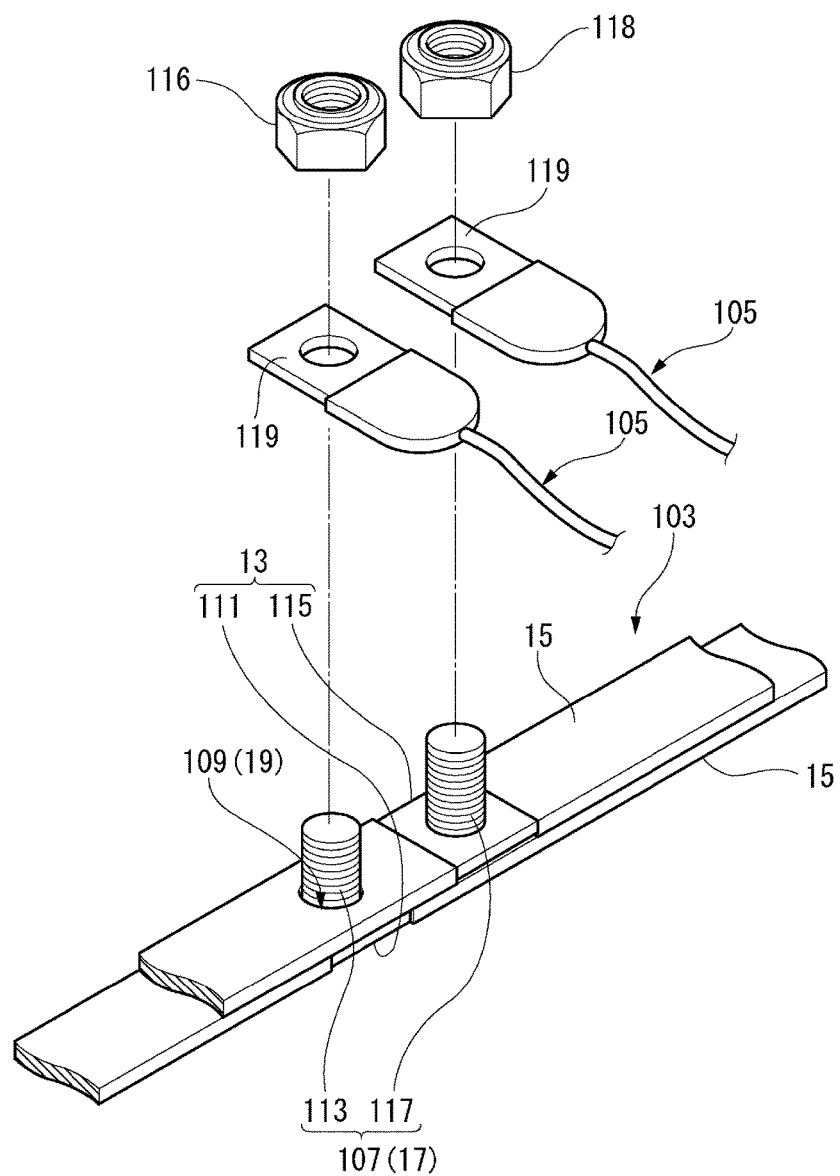
FIG. 12 is a perspective view illustrating main parts in which a laminated wiring body having a conductor connection structure of a laminated wiring body according to a third embodiment of the invention is illustrated together with a mating conductor.

Next, the description will be given about a third embodiment of a conductor connection structure of a laminated wiring body according to the invention. FIG. 12 is a perspective view partially illustrating a laminated wiring body 103 provided with the conductor connection structure of the laminated wiring body according to the third embodiment of the invention together with a terminal 119 of an electric wire 105 (mating conductor). In the third embodiment, the same members as those described in the first embodiment are assigned with the same symbols, and the redundant description will be omitted.

In the conductor connection structure of the laminated wiring body according to the third embodiment, as illustrated in FIG. 12, the connection portion 17 of the laminated wiring body 103 is formed of a stud bolt 107 which is a columnar fastening member erected from the plate wiring member 13. In the third embodiment, the leading-out portion 19 is formed of an insertion hole 109 which is bored in the plate wiring member 13 on the upper side and the insulating layer 15 to allow make the stud bolt 107 to pass therethrough.

In other words, a first stud bolt 113 is erected in the upper surface of a first plate wiring member 111 which is the plate wiring member 13 on the lower side. A second stud bolt 117 is erected in the upper surface of a second plate wiring member 115 which is the plate wiring member 13 on the upper side.

The insulating layer 15 may be provided after the stud bolt 107 is erected in the upper surface of the plate wiring member 13 not covered with the insulating layer 15. The stud bolt 107 may be erected after a predetermined region of the insulating layer 15 is removed from the upper surface of the plate wiring member 13 covered with the insulating layer 15. The stud bolt 107 is erected by bonding a base end surface of the shaft to the plate wiring member 13 through resistance welding, friction welding, or ultrasonic welding for example.

In the conductor connection structure of the laminated wiring body according to the third embodiment, the second stud bolt 117 is erected in the upper surface of the second plate wiring member 115 on the upper side. Similarly, in the upper surface of the first plate wiring member 111 on the lower side, the first stud bolt 113 is erected at a position where the first stud bolt 113 is not overlapped with the second stud bolt 117 erected in the second plate wiring member 115 on the upper side in the extending direction of the laminated wiring body 103. The first stud bolt 113 erected in the first plate wiring member 111 on the lower side passes through the insertion hole 109 formed in the second plate wiring member 115 on the upper side when the second plate wiring member 115 on the upper side is overlapped with the first plate wiring member 111 on the lower side. With this configuration, in the upper surface of the laminated wiring body 103, the first stud bolt 113 electrically connected to the first plate wiring member 111 on the lower side and the second stud bolt 117 electrically connected to the second plate wiring member 115 on the upper side are disposed in parallel in the extending direction (the right and left direction in the drawing) of the laminated wiring body 103.

The terminals 119 of the electric wires 105 (mating conductors) are fastened to the first stud bolt 113 and the second stud bolt 117 by nuts 116 and 118, respectively. The fastening member is not limited to the stud bolt 107 and, for example, the cylindrical shaft may be erected as a fastening member such that the leading end of the shaft inserted into the terminal 119 is plastically deformed and fastened by a rivet.

According to the conductor connection structure of the laminated wiring body of the third embodiment, a pair of the first stud bolt 113 and the second stud bolt 117 connected to the positive electrode and the negative electrode can be provided in parallel in the upper surface on the way in the extending direction of the laminated wiring body 103 which is relatively narrow.

Fourth Embodiment

Figure 13:
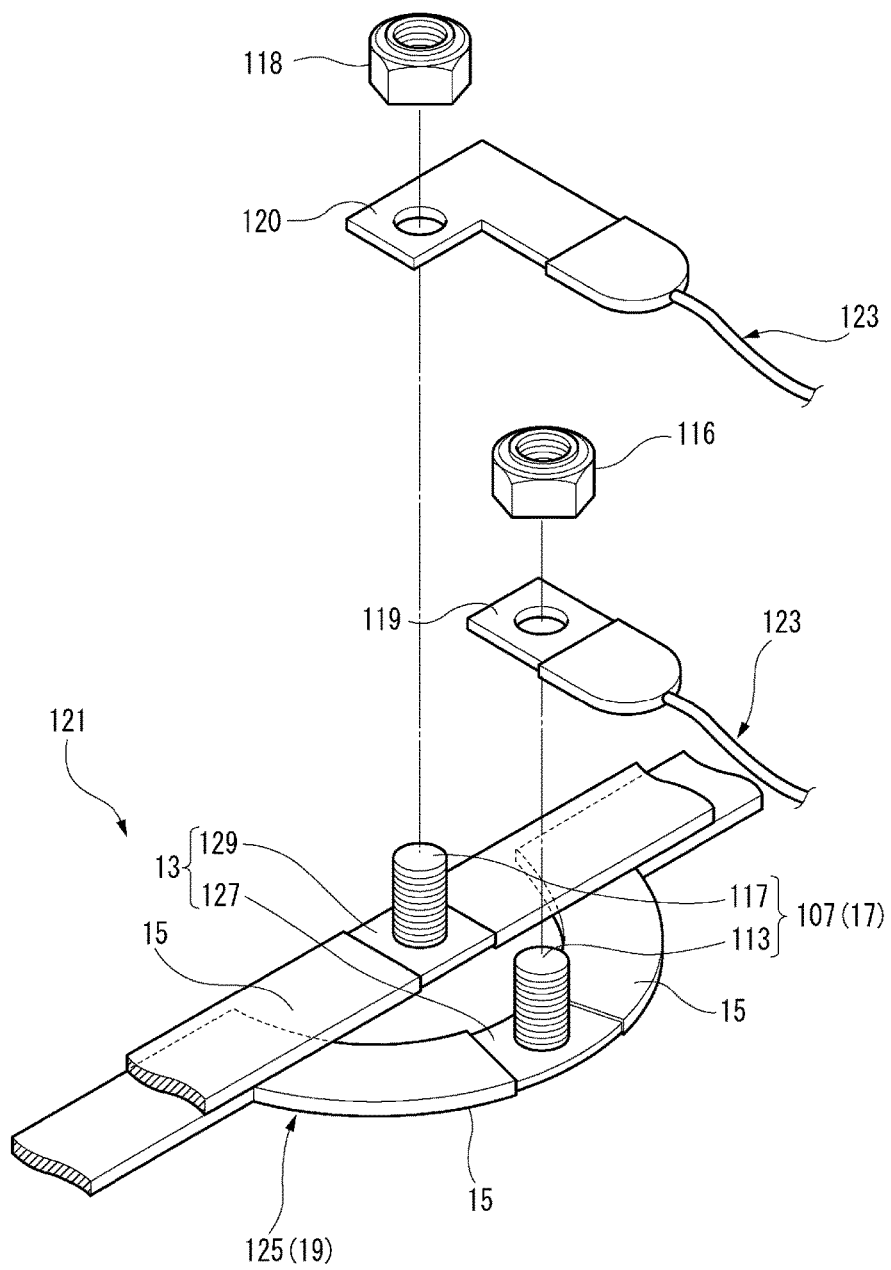
FIG. 13 is a perspective view illustrating main parts in which a laminated wiring body having a conductor connection structure of a laminated wiring body according to a fourth embodiment of the invention is illustrated together with a mating conductor.

Next, the description will be given about a fourth embodiment of a conductor connection structure of a laminated wiring body according to the invention. FIG. 13 is a perspective view partially illustrating a laminated wiring body 121 provided with the conductor connection structure of the laminated wiring body according to the fourth embodiment of the invention together with terminals 119 and 120 of an electric wire 123 which is a mating conductor. In the fourth embodiment, the same members as those described in the third embodiment are assigned with the same symbols, and the redundant description will be omitted.

In the conductor connection structure of the laminated wiring body according to the fourth embodiment, as illustrated in FIG. 13, the connection portion 17 of the laminated wiring body 121 is formed of the stud bolt 107 which is a columnar fastening member erected in the plate wiring member 13. In the fourth embodiment, the leading-out portion 19 is formed of a detour portion 125 which is bent (bent in the width direction of the plate wiring member 13) and comes out of the overlapping area of the plate wiring members 13 on the upper side.

In other words, the first stud bolt 113 is erected in the upper surface of the detour portion 125 in a first plate wiring member 127 which is the plate wiring member 13 on the lower side. The second stud bolt 117 is erected in the upper surface of a second plate wiring member 129 which is the plate wiring member 13 on the upper side.

In the conductor connection structure of the laminated wiring body according to the fourth embodiment, the second stud bolt 117 is erected in the upper surface of the second plate wiring member 129 on the upper side. In the first plate wiring member 127 on the lower side, the detour portion 125 is formed as the leading-out portion 19 which is bent and comes out of the overlapping area between the plate wiring members. The first stud bolt 113 is erected in the upper surface of the detour portion 125. The first stud bolt 113 erected in the detour portion 125 of the first plate wiring member 127 on the lower side is not overlapped with the second plate wiring member 129 on the upper side when the second plate wiring member 129 is overlapped with the first plate wiring member 127 on the lower side. With this configuration, in the upper surface of the laminated wiring body 121, a pair of the first stud bolt 113 and the second stud bolt 117 are disposed in parallel in the width direction perpendicular to the extending direction of the laminated wiring body 121.

The terminal 119 of the electric wire 123 (mating conductor) is fastened with the first stud bolt 113 by the nut 116. The terminal 120 of the electric wire 123 (mating conductor) is fastened with the second stud bolt 117 by the nut 118. the leading-out portion 19 may be configured such that the second plate wiring member 129 is bent in the width direction to form the detour portion 125, or the first and second plate wiring members 127 and 129 both are bent in the width direction to form the detour portion 125.

According to the conductor connection structure of the laminated wiring body of the fourth embodiment, a pair of the first stud bolt 113 and the second stud bolt 117 connected to the positive electrode and the negative electrode can be provided in parallel in the width direction of the laminated wiring body 121 which is relatively narrow. An insertion hole passing through the first stud bolt 113 of the first plate wiring member 127 on the lower side is not necessarily bored in the second plate wiring member 129 on the upper side, so that it is possible to prevent that a cross section in the second plate wiring member 129 on the upper side is reduced. The insulating layer 15 of the first plate wiring member 127 on the lower side is removed from the periphery of the first stud bolt 113, so that it is possible to secure a large contact area with respect to the terminal 119 of the electric wire 123.

Fifth Embodiment

Figure 14:
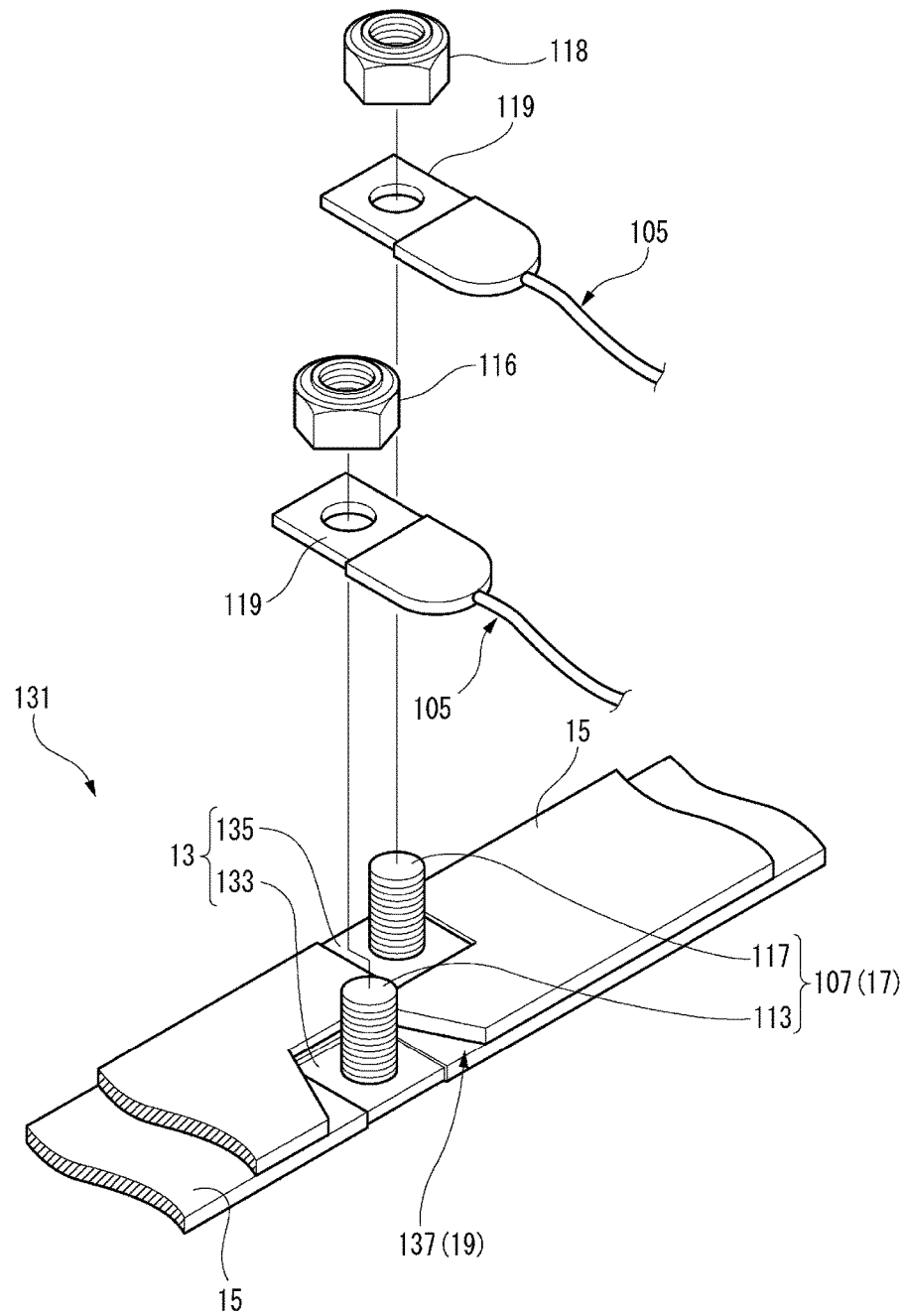
FIG. 14 is a perspective view illustrating main parts in which a laminated wiring body having a conductor connection structure of a laminated wiring body according to a fifth embodiment of the invention is illustrated together with a mating conductor.

Next, the description will be given about a fifth embodiment of a conductor connection structure of a laminated wiring body according to the invention. FIG. 14 is a perspective view illustrating a laminated wiring body 131 provided with the conductor connection structure of the laminated wiring body according to the fifth embodiment of the invention together with the electric wire 105 which is a mating conductor. In the fifth embodiment, the same members as those described in the third embodiment are assigned with the same symbols, and the redundant description will be omitted.

In the conductor connection structure of the laminated wiring body according to the fifth embodiment, as illustrated in FIG. 14, the connection portion 17 of the laminated wiring body 131 is formed of the stud bolt 107 which is a columnar fastening member erected in the plate wiring member 13. In the fifth embodiment, the leading-out portion 19 is formed of a notched portion 137 which is formed by cutting out one side edge in the width direction perpendicular to the extending direction of the plate wiring member 13 on the upper side so as to insert the stud bolt 107 thereinto.

In other words, the first stud bolt 113 is erected in the upper surface of a first plate wiring member 133 which is the plate wiring member 13 on the lower side. The second stud bolt 117 is erected in the upper surface of a second plate wiring member 135 which is the plate wiring member 13 on the upper side. One side edge in the width direction perpendicular to the extending direction of the second plate wiring member 135 on the upper side is cut out to form the notched portion 137 to insert the first stud bolt 113 thereinto.

In the conductor connection structure of the laminated wiring body according to the fifth embodiment, the second stud bolt 117 is erected in the upper surface of the second plate wiring member 135 on the upper side. Similarly, in the upper surface of the first plate wiring member 133, the first stud bolt 113 is erected at a position where the first stud bolt 113 is not overlapped with the second stud bolt 117 erected in the second plate wiring member 135 on the upper side in the extending direction of the laminated wiring body 131. The first stud bolt 113 erected in the first plate wiring member 133 on the lower side passes through the notched portion 137 formed in the second plate wiring member 135 on the upper side when the second plate wiring member 135 on the upper side is overlapped with the first plate wiring member 133 on the lower side. With this configuration, in the upper surface of the laminated wiring body 131, the first stud bolt 113 electrically connected to the first plate wiring member 133 on the lower side and the second stud bolt 117 electrically connected to the second plate wiring member 135 on the upper side are disposed in parallel in the extending direction (the right and left direction in the drawing) of the laminated wiring body 131.

The terminal 119 of the electric wire 105 (mating conductor) is fastened to the first stud bolt 113 by the nut 116. The terminal 119 of the electric wire 105 (mating conductor) is fastened to the second stud bolt 117 by the nut 118.

According to the conductor connection structure of the laminated wiring body of the fifth embodiment, a pair of the first stud bolt 113 and the second stud bolt 117 connected to the positive electrode and the negative electrode can be provided in parallel in the upper surface on the way in the extending direction of the laminated wiring body 131 which is relatively narrow. The insulating layer 15 of the first plate wiring member 133 on the lower side is removed from the periphery of the first stud bolt 113, so that it is possible to expose the first plate wiring member 133 coming into contact with the terminal 119 of the electric wire 105 (mating conductor) in the notched portion 137 and to secure a large contact area with respect to the terminal 119.

Therefore, according to the conductor connection structure of the laminated wiring body of this embodiment, the mating conductors (the card edge terminal 45 and the terminal 119) can be electrically connected to the plate wiring members 13 of the respective layers wiring member with a simple structure and ease, without increasing the number of components even at a position on the way in the extending direction of the laminated wiring body 11 (71, 103, 121, and 131) in which the plurality of plate wiring members 13 stacked.

The invention is not limited to the above embodiments, any combination of these configurations of the embodiments, changes obtained by being modified and applied by a person skilled in the art on the basis of the description of this specification and well-known techniques may be assumed to be included in the invention, and fall within the scope of claims.

Herein, the features of the embodiments of the conductor connection structure of the laminated wiring body according to the invention will be simply summarized in the following [1] to [7].

[1] A conductor connection structure of a laminated wiring body (11), including:
  a plurality of plate wiring members (13) which are made of a conductive material and stacked to each other;
  an insulating layer (15) which is arranged between the vertically-adjacent plate wiring members to insulate the vertically-adjacent plate wiring members;
  a connection portion (17) which is provided in an upper surface of each of the plate wiring members on a way in an extending direction of the plate wiring members; and
  a leading-out portion (19) which takes out the connection portion (17) of a lower plate wiring member among the plurality of plate wiring member while avoiding an upper plate wiring member among the plurality of plate wiring member, the lower plate wiring member is arranged at a layer lower than the upper plate wiring member in the laminated wiring body (the second plate wiring member 23, the third plate wiring member 25, and the fourth plate wiring member 27).

[2] The conductor connection structure of the laminated wiring body (11) according to [1], wherein the connection portion (17) is a raised piece (29) which is cut and raised in the plate wiring member (the first plate wiring member 21, the second plate wiring member 23, the third plate wiring member 25, and the fourth plate wiring member 27); and
  wherein the leading-out portion (19) has insertion holes (41) which are bored in both of the upper plate wiring member and the insulating layer (15) to allow the raised piece to pass therethrough.

[3] The conductor connection structure of the laminated wiring body (71) according to [1], wherein the connection portion (17) is a contact surface (73) provided in a partial region in an upper surface of the lower plate wiring member (the first plate wiring member 77, the second plate wiring member 81, the third plate wiring member 85, and the fourth plate wiring member 89); and
  wherein the leading-out portion (19) has exposure holes (75) which are bored in both of the upper plate wiring member (the second plate wiring member 81, the third plate wiring member 85, and the fourth plate wiring member 89) and the insulating layer (15) to expose the contact surface to an upper surface of the laminated wiring body (71).

[4] The conductor connection structure of the laminated wiring body (103) according to [1], wherein the connection portion (17) is a columnar fastening member (stud bolt 107) erected in an upper surface of the lower plate wiring member (13); and
  wherein the leading-out portion (19) has insertion holes (109) which are bored in both of the upper plate wiring member (first plate wiring member 111) and the insulating layer (15) to allow a fastening member (first stud bolt 113) to pass therethrough.

[5] The conductor connection structure of the laminated wiring body (121) according to [1], wherein the connection portion (17) is a columnar fastening member (stud bolt 107) erected in the plate wiring member (13); and
  wherein the leading-out portion (19) is a detour portion (125) which is bent in a width direction of the lower plate wiring member (first plate wiring member 127) to come out of an overlapping area of the plate wiring members (the first plate wiring member 127 and the second plate wiring member 129).

[6] The conductor connection structure of the laminated wiring body (131) according to [1], wherein the connection portion (17) is a columnar fastening member (stud bolt 107) erected in the lower plate wiring member (13); and
  wherein the leading-out portion (19) is a notched portion (137) which is provided by cutting out one side edge in a width direction of the upper plate wiring member perpendicular to the extending direction of the plate wiring members to insert the fastening member (first stud bolt 113) therein.

[7] The conductor connection structure of the laminated wiring body (11) according to any one of [1] to [6], wherein a plurality of plate wiring members (13) are stacked to form at least a pair of even layers which are electrically connected to a positive electrode and a negative electrode of a power source so as to be connected to an auxiliary component (61).

What is claimed is:

1. A conductor connection structure of a laminated wiring body comprising:
  a plurality of plate wiring members which are made of a conductive material and stacked to each other;
  an insulating layer which is arranged between the vertically-adjacent plate wiring members to insulate the vertically-adjacent plate wiring members;
  a connection portion which is provided in an upper surface of each of the plate wiring members on a way in an extending direction of the plate wiring members; and
a leading-out portion configured to permit a mating connector to be electrically connected to the connection portion of a lower plate wiring member among the plurality of plate wiring member while avoiding an upper plate wiring member among the plurality of plate wiring member, the lower plate wiring member is arranged at a layer lower than the upper plate wiring member in the laminated wiring body,
  wherein each of the plate wiring members terminates at a front end, a rear end, a first lateral edge and a second lateral edge, the first and second lateral edges extend from the front end to the rear end, and
  wherein each of the plate wiring members has a width that is measured from the first lateral edge to the second lateral edge, the width is uniform from the front end to the rear end.

2. The conductor connection structure of the laminated wiring body according to claim 1, wherein the connection portion is a raised piece which is cut and raised in the lower plate wiring member; and
  wherein the leading-out portion has insertion holes which are bored in both of the upper plate wiring member and the insulating layer to allow the raised piece to pass therethrough.

3. The conductor connection structure of the laminated wiring body according to claim 1, wherein the connection portion is a columnar fastening member erected in an upper surface of the lower plate wiring member; and wherein the leading-out portion has insertion holes which are bored in both of the upper plate wiring member and the insulating layer to allow the fastening member to pass therethrough.

4. The conductor connection structure of the laminated wiring body according to claim 1, wherein the plurality of plate wiring members are stacked to form at least a pair of even layers which are electrically connected to a positive electrode and a negative electrode of a power source so as to be connected to an auxiliary component.

5. The conductor connection structure of the laminated wiring body according to claim 2, wherein the connection portion includes an insulation layer on the raised piece and the insulation layer on the raised piece passes through the insertion holes.

6. The conductor connection structure of the laminated wiring body according to claim 1, wherein the connection portion is located between the first lateral edge and the second lateral edge of a respective one of the plate wiring members.

7. The conductor connection structure of the laminated wiring body according to claim 1, wherein each of the plate wiring portions is continuous across the width of the plate wiring portion from the first lateral edge to the second lateral edge at a location that is spaced away from the connection portions.

8. The conductor connection structure of the laminated wiring body according to claim 2, wherein the raised portion extends from the respective one of the plate wiring members and terminates at a free end that is spaced away from the respective one of the plate wiring members by a predetermined distance, and each of the plate wiring members includes a hole that corresponds to a respective one of the raised portions, and each of the holes has a length that corresponds with the predetermined distance of the respective one of the raised portions.

9. The conductor connection structure of the laminated wiring body according to claim 2, wherein each of the raised portion terminates at a free end that is spaced away from a bottommost one of the plate wiring members by a distance that is common to all of the raised portions.

10. The conductor connection structure of the laminated wiring body according to claim 4, wherein the columnar fastening member is a stud bolt.

* * * * *